United States Patent
Thoonen (10) Patent No.: US 8,076,763 B2
(45) Date of Patent: Dec. 13, 2011

(54) ELECTRICAL SHIELDING IN STACKED DIES BY USING CONDUCTIVE DIE ATTACH ADHESIVE

(75) Inventor: Henk Thoonen, Nijmegen (NL)

(73) Assignee: NXP B.V., Eindhoven (NL)

( * ) Notice: Subject to any disclaimer, the term of this patent is extended or adjusted under 35 U.S.C. 154(b) by 955 days.

(21) Appl. No.: 10/574,207

(22) PCT Filed: Oct. 1, 2004

(86) PCT No.: PCT/IB2004/051952
§ 371 (c)(1),
(2), (4) Date: Jan. 3, 2008

(87) PCT Pub. No.: WO2005/034238
PCT Pub. Date: Apr. 14, 2005

(65) Prior Publication Data
US 2008/0315432 A1 Dec. 25, 2008

Related U.S. Application Data

(60) Provisional application No. 60/507,823, filed on Oct. 1, 2003.

(51) Int. Cl.
*H01L 25/065* (2006.01)
*H01L 23/52* (2006.01)
*H01L 21/00* (2006.01)

(52) U.S. Cl. ......... 257/686; 257/E23.052; 257/E23.114; 257/E25.013; 257/685; 257/777; 257/723; 257/786; 257/784; 257/737; 257/E21.001

(58) Field of Classification Search .................. 257/686, 257/685, 777, 723, 784, 737, 691, 659, 660, 257/E23.052, E23.114, E25.013, 786, E21.001
See application file for complete search history.

(56) References Cited

U.S. PATENT DOCUMENTS

| 6,232,668 | B1 | 5/2001 | Hikita et al. | |
|---|---|---|---|---|
| 6,713,856 | B2 * | 3/2004 | Tsai et al. | 257/686 |
| 6,762,488 | B2 * | 7/2004 | Maeda et al. | 257/686 |
| 6,803,254 | B2 * | 10/2004 | Park et al. | 438/109 |
| 6,815,746 | B2 * | 11/2004 | Suzuki et al. | 257/296 |
| 2002/0050635 | A1 | 5/2002 | Ogura et al. | |
| 2003/0155635 | A1 * | 8/2003 | Ishiyama | 257/666 |

(Continued)

FOREIGN PATENT DOCUMENTS

| EP | 0 740 343 | 10/1996 |
|---|---|---|
| JP | 2001 135777 | 5/2001 |
| WO | WO 03/046098 | 6/2003 |

*Primary Examiner* — A O Williams (57) ABSTRACT

In example embodiment, there is an integrated circuit (IC) device (5) assembled in a package (5) having a plurality of die including a first device (20) and at least one additional device (30). The IC comprises a substrate (10). A first device die (20), having bonding pads including ground connections, is die attached to the substrate (10). An additional device die (30), having bonding pads including ground connections is disposed on top of the first device die (20). The additional device die is die attached to the first device die. The ground connections of the first device die are connected to the ground connections of the additional device die in order to minimize the electrical interference between the device dies. An additional feature of the embodiment is, ground connections of the first device are connected to the ground connections of the additional device with a conductive adhesive (25).

13 Claims, 8 Drawing Sheets

U.S. PATENT DOCUMENTS

| | | | |
|---|---|---|---|
| 2004/0264390 A1* | 12/2004 | Suzuki | 370/260 |
| 2005/0006745 A1* | 1/2005 | Nishimura | 257/686 |
| 2007/0111384 A1* | 5/2007 | Kinoshita et al. | 438/106 |
| 2009/0059545 A1* | 3/2009 | Shioga et al. | 361/782 |
| 2011/0001240 A1* | 1/2011 | Merilo et al. | 257/738 |
| 2011/0068444 A1* | 3/2011 | Chi et al. | 257/669 |

* cited by examiner

ELECTRICAL SHIELDING IN STACKED DIES BY USING CONDUCTIVE DIE ATTACH ADHESIVE

CROSS REFERENCE TO RELATED APPLICATION

This application claims the benefit of U.S. provisional application Ser. No. 60/507,823 filed Oct. 1, 2003, which is incorporated herein whole by reference.

The invention relates to electronics packaging. More particularly the invention relates to the use of conductive die attach adhesive to provide electrical shielding in an array of stacked integrated circuit devices.

As integrated circuit technology improves to increase the density and complexity of devices that may be rendered in a given area of substrate, a significant challenge is posed to the packaging of these devices. In computer applications, for example, the width of the data bus has increased from 16, 32, 64, to 128 bits and beyond. During the movement of data in a system it is not uncommon for a bus to have simultaneously switching outputs (SSOs). The SSOs often result in the power and ground rails of the chip experiencing noise owing to the large transient currents present during the SSOs. If the noise is severe, the ground and power rails shift from their prescribed voltage causing unpredictable behavior in the chip.

As the technology evolves, a trend of miniaturization and a drive towards Multi Chip Modules (MCM) and System in Package (SIP) can be observed. These trends bring in a move towards three-dimensional (3D) packaging, that is, the stacking of multiple device dies on top of one other.

A significant challenge in the stacking of multiple device dies is the possibility of electrical interference among them, especially in situations in which analog and digital devices are combined or if one of the device die is a high frequency device, the interference created may cause devices to malfunction. There is a need to prevent electrical interference in packaged devices having multiple device dies stacked on one another. A way to minimize electrical interference is to make robust the grounding between the device dies and the package. The present invention provides a structure and method for achieving grounding between stacked dies and the package In an example embodiment, there is an integrated circuit (IC) device assembled in a package having a plurality of die including a first device and at least one additional device. The IC comprises a substrate. A first device die, having bonding pads including ground connections, is die attached to the substrate. An additional device, having bonding pads including ground connections is disposed on top of the first device. The additional device is die attached to the first device. The ground connections of the first device are coupled to the ground connections of the additional device. A feature of this embodiment, is that the ground connections of the first device are connected to the ground connections of the additional device with a conductive adhesive.

In another example embodiment, there is a method for packaging an integrated circuit (IC) having a plurality of die including a first device and at least one additional device, and having a grounded substrate. The method comprises attaching a first device onto a substrate, the substrate ground connections. On the first device, an insulating material is applied. The additional device die is attached onto the insulating material. At predetermined ground connections, the first device die is bonded to the second device die. The predetermined ground connections are then bonded to the substrate ground connections. A feature of this embodiment is that the bonding of the first device to the additional device at predetermined ground connections includes: using at least one of the following: conductive adhesive, a solder re-flow, and a conductive interposer.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which:

The present invention has been found to be useful in the assembly of electronic circuits having multiple die stacked on top of one another. The grounding areas of the multiple die are coupled together enhancing the integrity of ground in the electronic circuits. In grounding selected device pads in a multiple die assembly, it will be appreciated that the term grounding may applied to those regions on a device or package that are connected in common, such as power supply nodes. These power supply nodes may be at zero, positive, or negative volts. For example, in some CMOS devices there may be multiple power supply rails, such as zero volts (ground), =1.2v, 3.3v, 5.0v, etc. In modern packaging is it not uncommon to have multiple power supply nodes, including those for ground.

Figure 1:
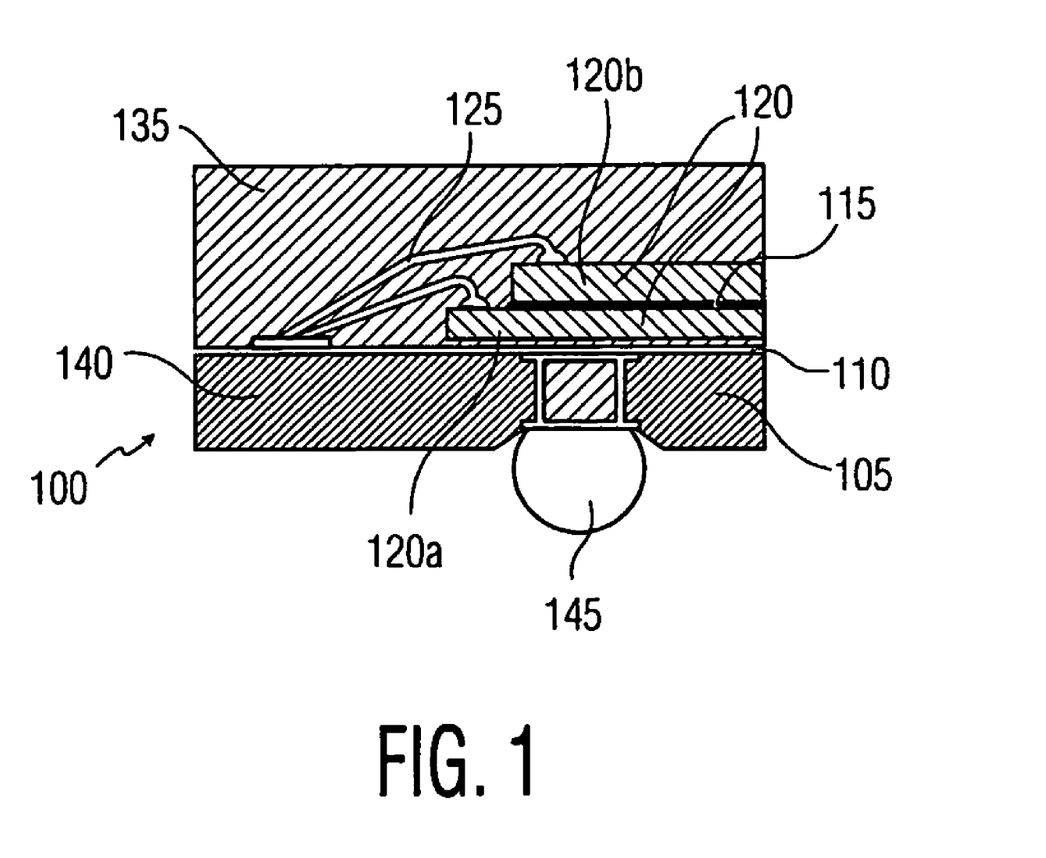
FIG. 1 depicts in side view, bonding of two device die in accordance with an embodiment of the present invention.

In an example embodiment according to the present invention, in a ball grid array package (BGA) at a ball location is coupled to a grounding location for a pair of die stacked on top of each other. Referring to FIG. 1, a package assembly 100 includes a substrate 105 with a ball assembly 145 providing electrical connection to a package-bonding pad 140 through conductive traces (not illustrated). A first die 120*a* is attached to the substrate 105 with an adhesive 110. The adhesive may be both film and liquid. Alternatives to adhesive may include soldering or eutectic die attach. Placed on top of the first die 120*a* is a second die 120*b*. The dies 120 are electrically coupled via a conductive adhesive 115. The circuit may be designed so that the second die 120b is smaller in area by predetermined amount than that of the first die 120a and that there is accommodation made in the first die 120a for placement of the second die 120b. The accommodation may include, but is not limited to, electrical bond pads to couple the underside of the second die 120b to the first die 120a. An insulating film (refer to FIGS. 5A and 5B) may be placed between the two die with appropriate openings defined therein to only allow the conductive adhesive 115 to bond in regions in which electrical contact is desired. Bond wires 125 couple ground pads on dies 120 to bonding pad 140. In a completed package assembly 100, a molding compound 135 seals the electrical circuit from the outside environment.

In another example embodiment, the second die 120b may have a metallization (not shown) applied to the underside to enhance the conductivity of the ground connection facilitated by the conductive adhesive. Such metallization would likely be applied during the latter stages of wafer fabrication, after completion of the final topside passivation.

Figure 2A:
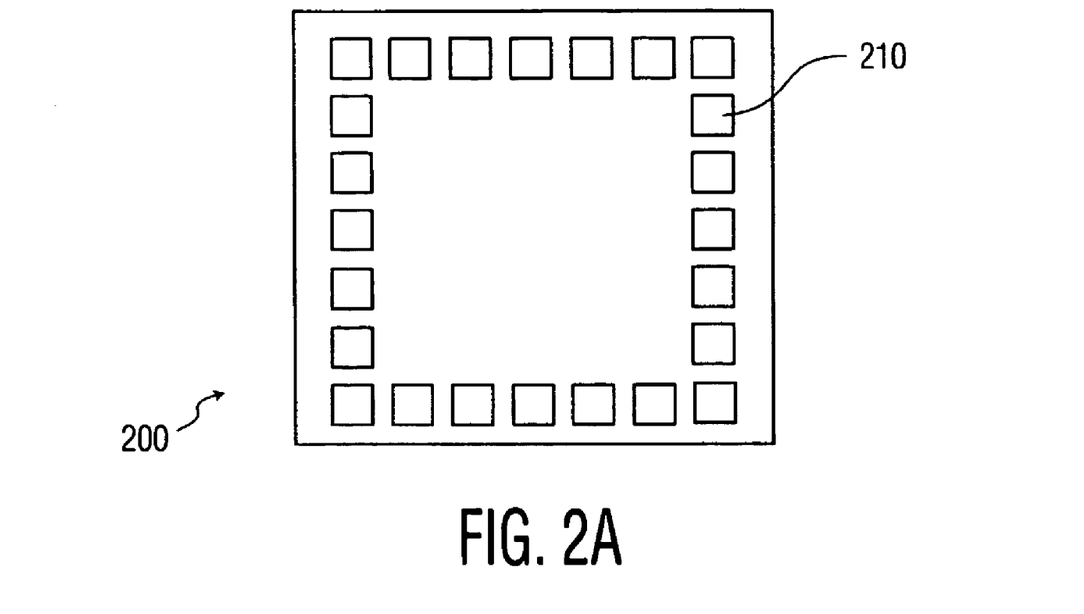
FIG. 2A is an example pad layout for a die to be packaged.
Figure 2B:
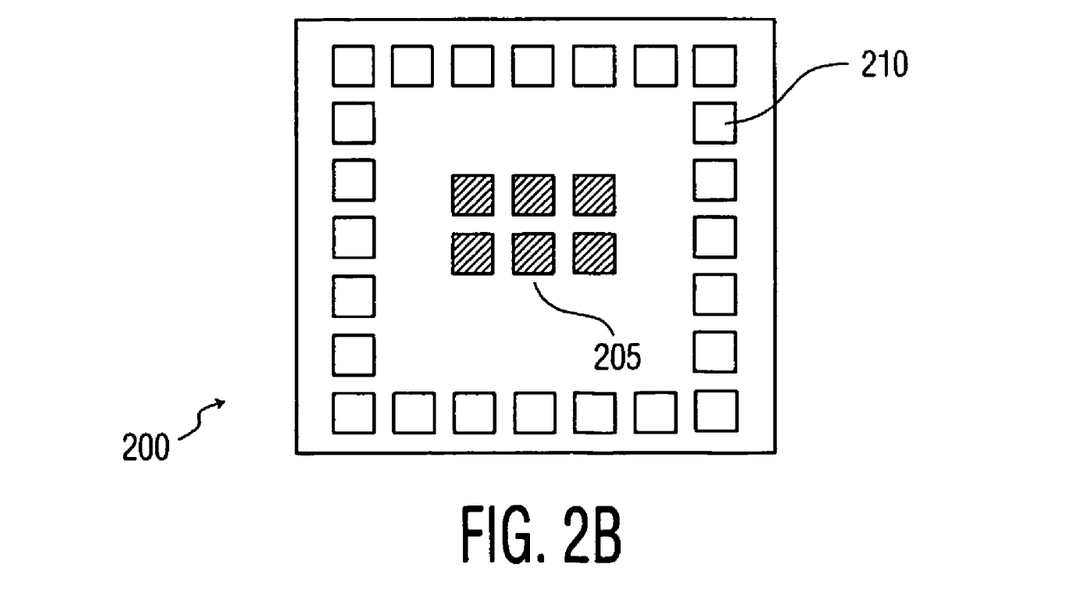
FIG. 2B illustrates an example pad layout having grounding pads for use in an embodiment according to the present invention.

Referring to FIGS. 2A and 2B. Die 200 has an arrangement of bond pads 210. In applying an embodiment of the present invention, during the design and layout process, the circuit may be arranged to have interior pads 205 connected to ground in the core area of the die, as well as the typical bond pads 210. The interior pads 205 may be laid out to make optimum use of the core area. The interior pads 205 may be located at the center (as illustrated in FIG. 2B) or be offset from the center at appropriately defined areas.

Figure 3:
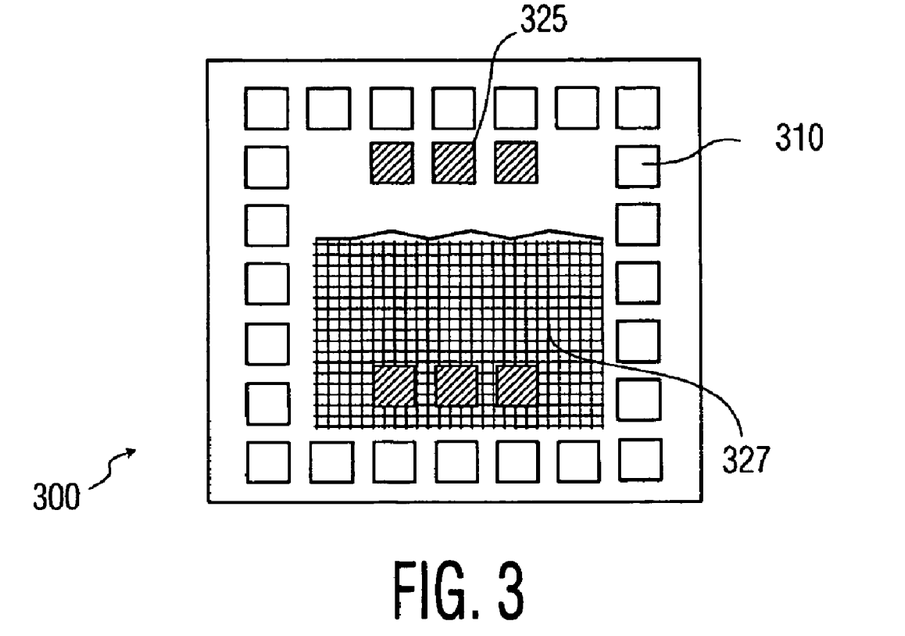
FIG. 3 depicts in top view, an example of two die stacked and bonded together according to an embodiment of the present invention.
Figure 5A:
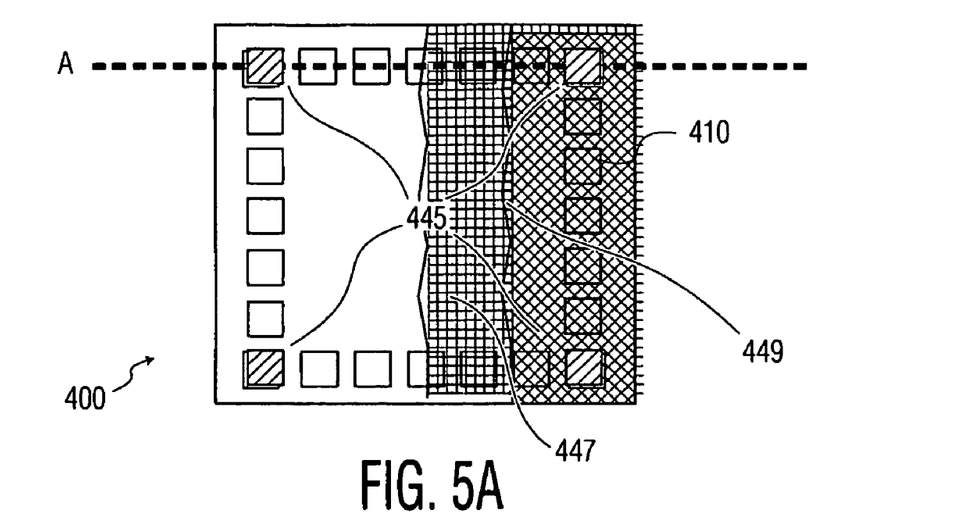
FIG. 5A illustrates in top view of stacked die in an example embodiment according to the present invention.

Referring to FIG. 3, in an example embodiment, on a device die 300, the grounding pads 325 are located near the bond pads 310. Layer 327 is an insulating mask that exposes the grounding pads 325 but protects the die 300 from unintended ground connections after the application of a conductive adhesive 449 such as shown in FIG. 5A.

Figure 4:
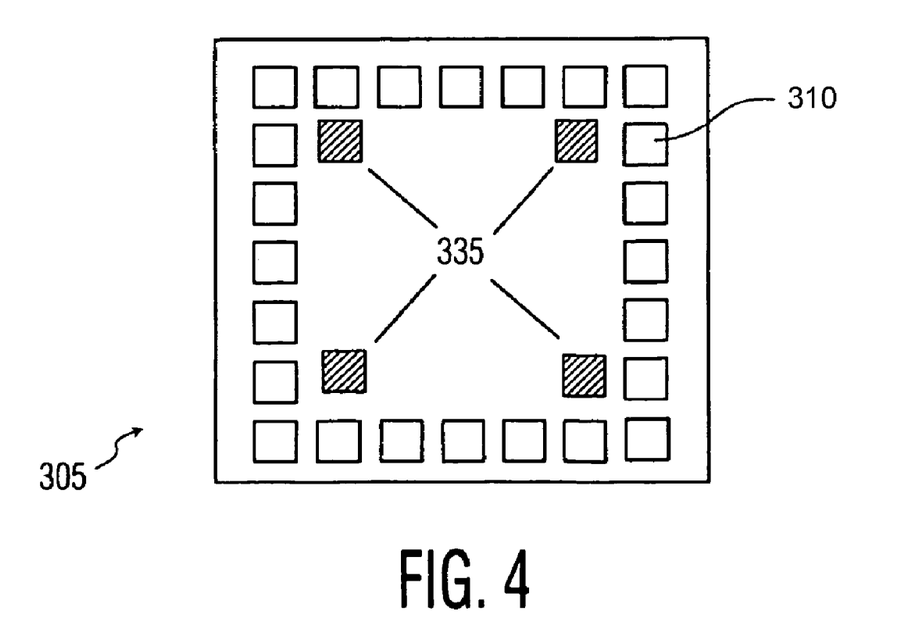
FIG. 4 depicts in top view, an example of an alternative placement of grounding pads according to an embodiment of the present invention.

Referring to FIG. 4, in an example embodiment, a device die 305 has the grounding pads 335 located at the corners of the core area near the bonding pads 310.

Figure 5B:
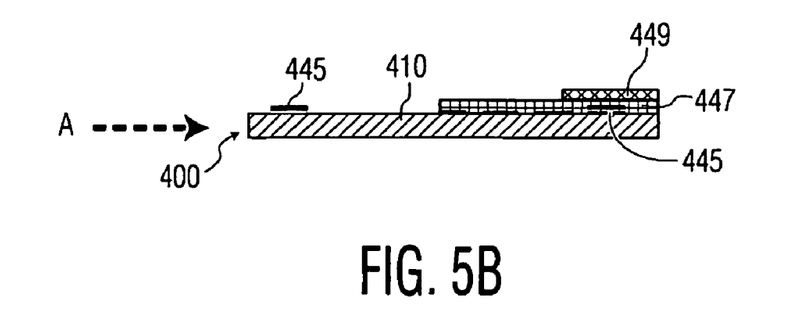
FIG. 5B is a cross-section of the example of FIG. 5A.

Referring to 5A, in an example embodiment, the device 400 has grounding pads 445 located at the corners of the bonding pads 410. In a partial view, an insulating mask 447 has openings for the grounding pads 445. Upon the insulating mask 447, the conductive adhesive 449 is applied. A cross-section at the "A" dashed-line is depicted in FIG. 5B. In this example, areas of the second die, stacked upon the first die, are comparable. The bonding pads 410 may be bonded via wire bonds, tape, or other suitable connection that can undergo stress of placing the insulating mask 447 thereon. The resulting structure is a sandwich of two similarly sized device die.

If the passivation is sufficiently impermeable, the conductive adhesive may be directly applied to the first die to electrically couple the second die's grounding to that of the first die.

Figure 6:
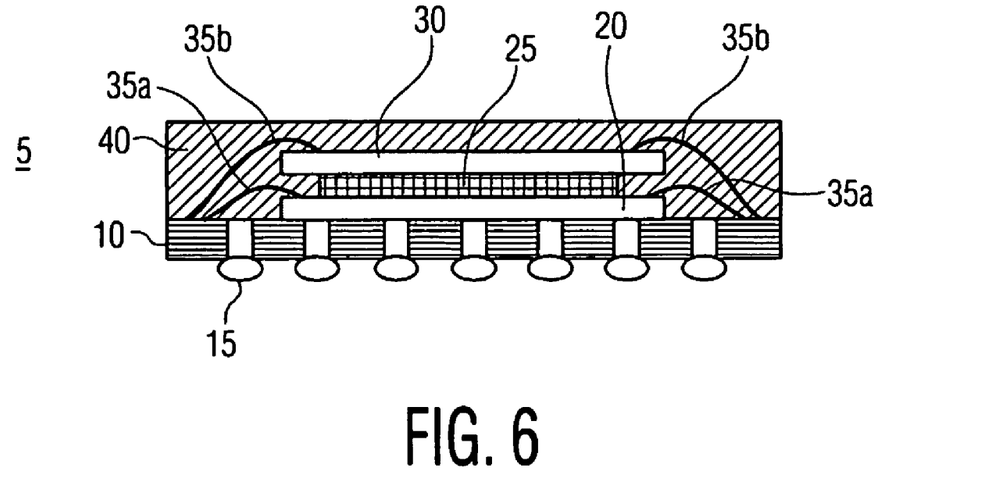
FIG. 6 illustrates, in side view, the stacking two same-sized die in an example embodiment according to the present invention.

Referring to FIG. 6, in an example embodiment, two die of the same size may be joined together according to the present invention. In a BGA package 5, two die are mounted on a BGA substrate 10. The balls 15 connect to bonding pads via circuit traces (not illustrated) in the substrate 10. A first die 20 of a given size has a conductive interposer 25 applied to its surface. The conductive interposer 25 may have conductive adhesive to bond the two die to one another. The stiffness of the interposer 25 prevents the second die from squishing the bond wires 35a of the first die. The second die 30 is attached to the conductive interposer 25. Bond wires 35a connect the first die 20 and bond wires 35b connect the second die 30 to the BGA via package bonding pads. The interposer 25 provides sufficient clearance for the first bond wires. After the two die are wire bonded, the assembly is sealed with an encapsulating compound 40.

Figure 7:
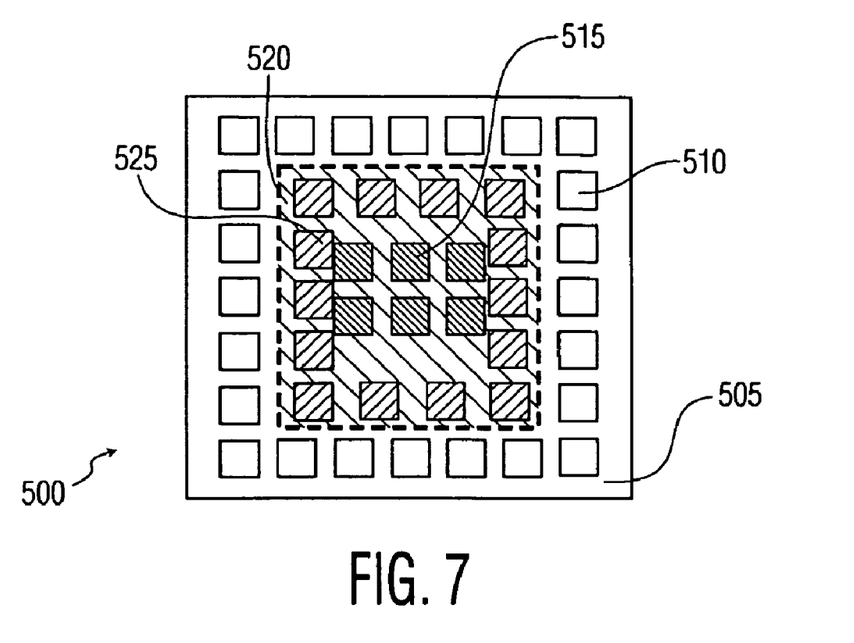
FIG. 7 depicts the stacking of two die in an example embodiment according to the present invention.

Referring to FIG. 7, in an example embodiment according to the present invention, a circuit device 500 has two die stacked upon each other. A first die 505 has bonding pad ring 510. Grounding pads 515 are situated about the center of the first die 505. A second die 520, on its underside, is attached to the grounding pads 515 with a conductive adhesive. The second die 520 is smaller than the first die 505. The bond pads 525 may be arranged so as to facilitate both the wire bonding of the first die's 505 bonding pads 510 and the second die's 520 bonding pads 525. There may be an insulating mask placed upon the first die 505 if it is likely that the conductive adhesive may make unintended connections to ground.

Figure 8:
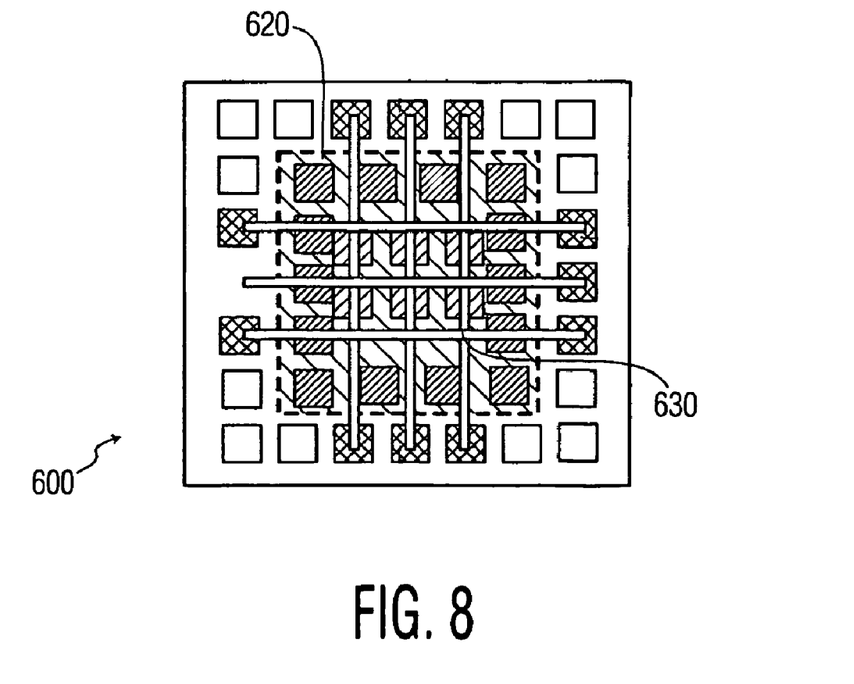
FIG. 8 illustrates the use of a cross bar grid to connect ground pads together in example embodiment according to the present invention.

Referring to FIG. 8, in an example embodiment, in place of grounding pads 515, a conductive grid 630 may be laid across the die and be coupled to bonding pads defined as ground. The defining of grounded bonding pads may be part of the device's design process. The second die 620 on its underside may then be bonded with conductive adhesive to couple the second die 620 to the ground. The conductive grid 630 may a suitable conductor, such as copper, aluminum, gold, silver, and alloys thereof. Cost and process dictate which metal is suitable. Furthermore, the coefficient of thermal expansion (CTE) is important to material choice in that materials chosen should have similar CTE. Dissimilar CTE of the materials that build a package would ultimately lead to premature mechanical failure.

Figure 9:
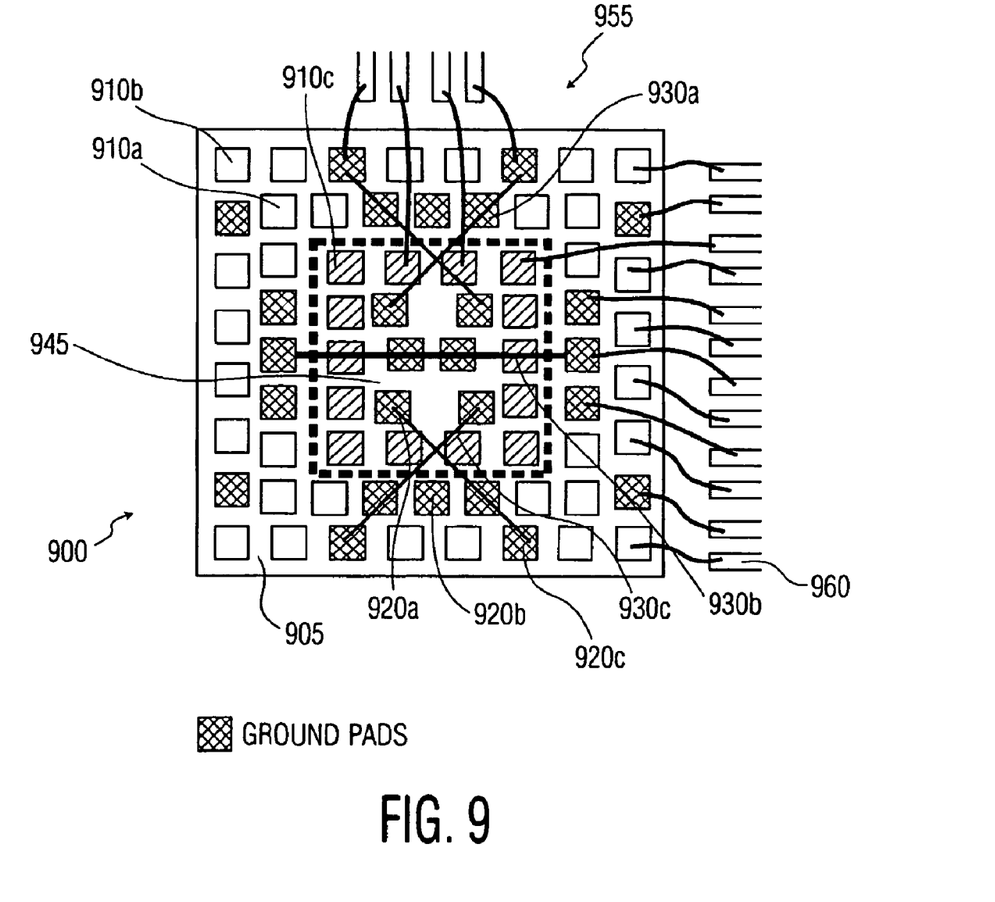
FIG. 9 illustrates using straps to connect grounds together in accordance with another embodiment of the present invention.

Referring to FIG. 9, in another example embodiment, a device 900 may have a first die 905 and a second die 945 coupled together at ground a designated bonding pads 920a, 920b, and 920c chosen from the bonding pads 910a, 910b, and 910c. In this example, the first die 905 may have staggered bond pads in two rings, pads 910a and pads 910b. As mentioned earlier, these grounding pads would be designated during the design phase of the first die 905 and the second die 945. Conductive straps 930a, 930b, and 930c couple the electrical grounding of die 905 and 945 by their connection to grounded bonding pads 920a, 920b, and 920c. Sample, pad landings 960 connect the bonding pads 910a, 910b, 910c with bond wires 955. A number of these pad landings 960 are defined as ground. These multiple connections make for a robust ground. Likewise, in another example embodiment, the present invention may be used to make robust power connections. Having both robust ground and power connections reduces the multi-chip device's susceptibility to noise, such as ground bounce during bus switching.

Figure 10:
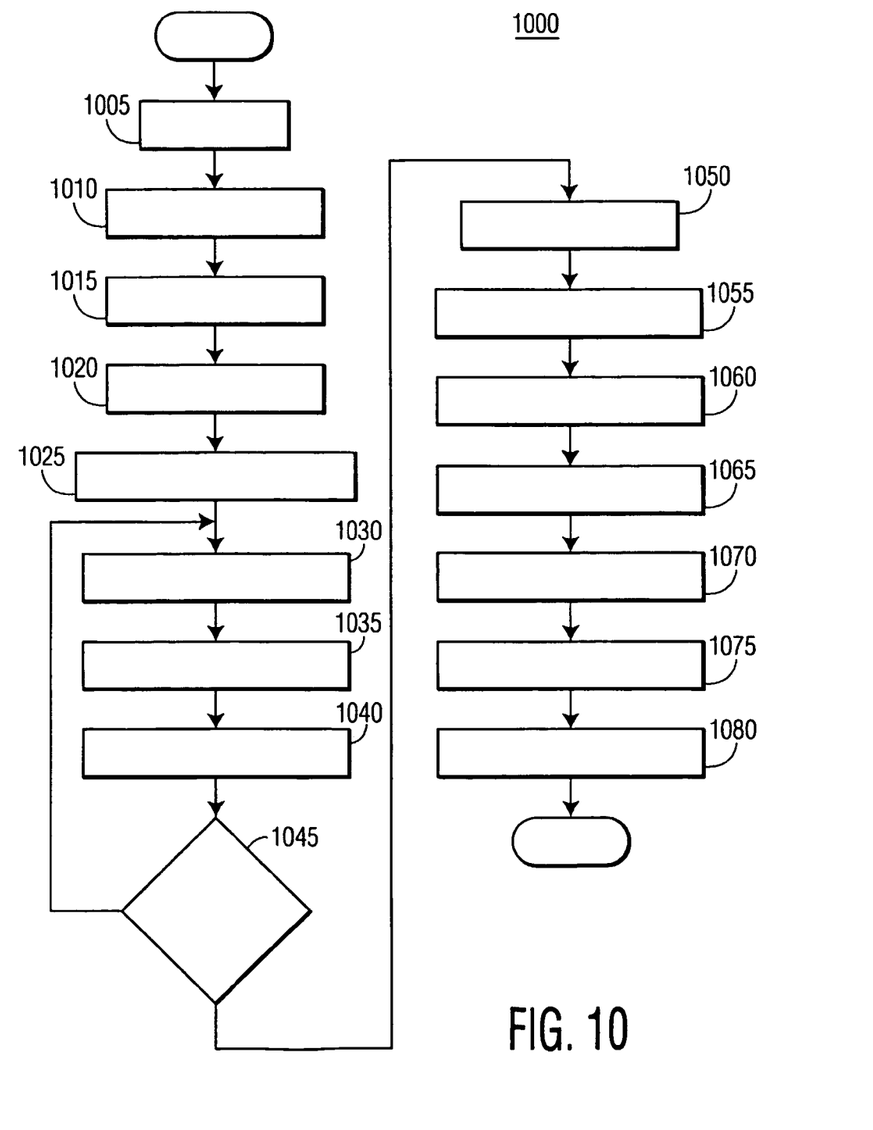
FIG. 10 depicts an assembly process flow for a two-stacked die array in accordance with an embodiment of the present invention.

Referring to FIG. 10, in an example embodiment, there is a process 1000 for assembling a package having two or more device die. The user selects a suitable substrate 1005 having a landing upon which a die may be attached. Paste or other suitable adhesive 1010 is dispensed on the landing and a first die is attached 1015. To adhere the die securely, a snap curing or oven curing 1020 is performed. This curing stabilizes the adhesive, to prevent the die from moving. Since the adhesive is conductive, the user is able to couple the ground of the first die with that of the additional die. For the first insulating layer, a suitable film is cut to predefined dimensions and laminated 1025 on the die Typically the wafer is laminated with an adhesive tape. A second die is attached 1030 by similar steps outlined earlier In case a film die attach is used, the second die attach is only a die placement. Following the second die attach 1030, the package undergoes a film curing 1035. The second curing step is to cure the die attach compound and make sure the second die is fixed, so it does not shift in later processing. The package having two die attached undergoes a plasma cleaning 1040. Plasma cleaning is organically cleaning the module so as to make the bond pads free of organic contamination. If there are additional die to attach 1045, the process is repeated from 1030 through 1040. Otherwise, the assembly having at least two die, undergoes wire bond 1050. After wire bond 1050, the assembly goes through an additional plasma cleaning 1055. Having cleaned the assembly, the multiple dies are encapsulated in a molding compound 1060. Being a ball grid array package the balls are placed in the predetermined locations 1065. Depending on what ball count and ball pitch, JEDEC defines certain industry guidelines that need to be incorporated. In manufacturing, balls may be placed where desired. The most common way to do ball attach is to have a predefined pattern on a stencil. The balls will then be placed all at once from the stencil pattern defined on the substrate. After ball placement 1065, singulation 1070 is performed. Parts are typically processed in strip form, having a number of parts are in a strip. This strip is the carrier used to guide the parts through assembly. Typically all indexing holes used for positioning the parts at each machine are in the strip. During the singulation step, the BGA parts are milled, stamped or sawn out of it strip. Having completed the packaging, the assembled package is marked 1075. Before, shipping to the end user the multiple-die device is tested 1080. Such testing is performed on ATE with hardware and software suitable for the multiple-die device. Although the aforementioned example covers BGA. Package, the process may be modified for use ed in lead frame packages, etc.

While the present invention has been described with reference to several particular example embodiments, those skilled in the art will recognize that many changes may be made thereto without departing from the spirit and scope of the present invention, which is set forth in the following claims.

What is claimed is:

1. An integrated circuit device assembled in a package having a plurality of die including a first device and an additional device, the IC comprising:
   a substrate;
   a first device die, having bonding pads including ground connections, the first device die attached to the substrate;
   an additional device die having bonding pads including ground connections, the additional device die disposed on top of the first device die, the additional device die attached to the first device die, wherein the ground connections of the first device die are connected to the ground connections of the additional device die; and
   a conductive adhesive disposed between the first device die and the second device die, wherein the ground connections of the first device die are connected to the ground connections of the additional device die with the conductive adhesive.

2. The IC of claim 1 wherein the ground connections may be at voltages other than zero.

3. The IC of claim 1 further comprising an insulating material placed in between the first device die and the additional device die, the insulating material having openings allowing for the connecting of ground connections there-through between the first device die and the additional device die.

4. The IC of claim 3 wherein the conductive adhesive is flowed through the openings in the insulating material connecting the ground connections between the first device die and the additional device die.

5. The IC of claim 1 further comprising: a package ground connection, wherein the package ground connection is connected to the ground connections of the first device die and the additional device die at a plurality of predetermined locations.

6. The IC of claim 1 wherein the first device die is of a first predetermined area and the additional device die is of an additional predetermined area, the first predetermined area being greater than the additional predetermined area.

7. The IC of claim 1 wherein the first device die, having a core region surrounded by a pad ring, includes ground connections in at least one of the following locations: about the center of the first device die in the core region, on predetermined locations about the pad ring of the first device die; and the additional device die, having a core region surrounded by a pad ring and ground connections on a predetermined underside location includes ground connections in at least one of the following locations: about the center of the additional device die in the core region, on predetermined locations about the pad ring of the additional device die, at predetermined locations on the underside location of the additional device die.

8. The IC of claim 7 wherein, the ground connections on the predetermined locations of the pad ring of the first device die are coupled to the ground connections on the predetermined locations of the pad ring of the additional device die are coupled with a plurality of ground straps.

9. The IC of claim 8 wherein, the plurality of ground straps comprise a conductive material including at least one of the following: gold, silver, aluminum, copper, and alloys thereof.

10. The IC of claim 8, wherein the plurality of ground straps include at least one of the following: a lattice structure, ground straps connecting grounds nearest one another.

11. A method for packaging an integrated circuit having a plurality of die including a first device and an additional device, and having a grounded substrate, the method comprising:
    attaching a first device die onto a substrate;
    applying an insulating material on the first device die;
    attaching an additional device die onto the insulating material; and
    using a conductive adhesive to bond the first device die to the additional device die at predetermined ground connections on the first device die to predetermined ground connections on the additional device die, and bonding the predetermined ground connections to ground nodes of the substrate.

12. The method of claim 11, wherein the insulating material has predefined openings therein, the predefined openings corresponding to the predetermined ground connections on the first device die and the predetermined ground connections on the additional device die.

13. A method for packaging an integrated circuit having a plurality of die including a first device and at least one additional device, the method comprising:
    attaching a first device die onto a substrate;
    applying a conductive adhesive on the first device die; and
    attaching an additional device die onto the conductive adhesive, wherein the conductive adhesive connects the first device die at predetermined ground connections to predetermined ground connections on the additional device die.

* * * * *